(12) United States Patent
Krymski

(10) Patent No.: US 8,054,209 B2
(45) Date of Patent: **\*Nov. 8, 2011**

(54) VARIABLE QUANTIZATION ADC FOR IMAGE SENSORS

(75) Inventor: Alexander Krymski, La Crescenta, CA (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/435,224

(22) Filed: May 4, 2009

(65) Prior Publication Data

US 2009/0212987 A1     Aug. 27, 2009

Related U.S. Application Data

(60) Division of application No. 11/523,097, filed on Sep. 19, 2006, now Pat. No. 7,541,963, which is a continuation of application No. 10/693,462, filed on Oct. 27, 2003, now Pat. No. 7,148,831.

(51) Int. Cl.
*H03M 1/12* (2006.01)

(52) U.S. Cl. ........ 341/155; 341/118; 341/120; 341/164; 341/165; 341/170

(58) Field of Classification Search .......... 341/118–120, 341/155, 164, 165, 169, 170
See application file for complete search history.

(56) References Cited

U.S. PATENT DOCUMENTS

| | | | |
|---|---|---|---|
| 5,886,659 A | 3/1999 | Pain et al. | |
| 5,920,247 A | 7/1999 | Pischinger et al. | |
| 5,920,274 A | 7/1999 | Gowda et al. | |
| 6,271,785 B1 | 8/2001 | Martin et al. | |
| 6,469,739 B1 * | 10/2002 | Bechtel et al. | 348/302 |
| 6,518,910 B2 | 2/2003 | Sakuragi | |
| 6,542,105 B2 * | 4/2003 | Sakuragi | 341/164 |
| 6,545,624 B2 * | 4/2003 | Lee et al. | 341/155 |
| 6,621,442 B1 * | 9/2003 | Murphy | 341/155 |
| 6,670,904 B1 * | 12/2003 | Yakovlev | 341/167 |
| 6,707,410 B1 * | 3/2004 | Bock | 341/155 |
| 6,720,999 B1 | 4/2004 | Holberg et al. | |
| 6,741,198 B2 | 5/2004 | McIlrath | |
| 6,829,012 B2 | 12/2004 | Tarnoff et al. | |
| 6,864,820 B2 | 3/2005 | Nakamura et al. | |
| 6,943,719 B2 | 9/2005 | Yun et al. | |
| 7,095,355 B1 * | 8/2006 | Graham et al. | 341/169 |
| 7,148,831 B2 * | 12/2006 | Krymski | 341/155 |
| 7,227,488 B2 * | 6/2007 | Cho | 341/155 |
| 7,230,558 B2 * | 6/2007 | Lim | 341/155 |
| 7,230,561 B2 * | 6/2007 | Lee | 341/172 |
| 7,233,277 B2 * | 6/2007 | Roh | 341/169 |
| 2006/0290552 A1 * | 12/2006 | Roh et al. | 341/155 |

OTHER PUBLICATIONS

M. Sasaki, et al., "A Wide Dynamic Range CMOS Image Sensor with Integration of Short-Exposure-Time Signals," 2003 IEEE Workshop, May 15-17, 2003.

R. Johansson, et al., "A Multi-Resolution 100 GOPS 4 Gpixels/s Programmable CMOS Image Sensor for Machine Vision," 2003 IEEE Workshop, May 15-17, 2003.

* cited by examiner

*Primary Examiner* — Linh Nguyen
(74) *Attorney, Agent, or Firm* — Lerner, David, Littenberg, Krumholz & Mentlik, LLP

(57) ABSTRACT

An A/D converter suitable for use in a system in which the signal power of noise increases with the signal power of the signal, such as an imaging system, utilizes a variable quantization system for converting analog signals into digital signals. The variable quantization is controlled so that at low signal levels the quantization is similar or identical to conventional A/D converters, while the quantization level is increased at higher signal levels. Thus, higher resolution is provided at low signal levels while lower resolution is produced at high signal levels.

13 Claims, 8 Drawing Sheets

VARIABLE QUANTIZATION ADC FOR IMAGE SENSORS

This application is a divisional of application Ser. No. 11/523,097, filed Sep. 19, 2006, now U.S. Pat. No. 7,541,963 which is a continuation of application Ser. No. 10/693,462, filed Oct. 27, 2003, now U.S. Pat. No. 7,148,831. The entirety of each related application is hereby incorporated herein by reference in its entirety.

FIELD OF INVENTION

The present invention relates to an imaging system. More specifically, the present invention is directed to the use of variable quantization while performing analog-to-digital (A/D) conversion in an imaging system.

BACKGROUND OF THE INVENTION

FIG. 1 is an illustration of a conventional imaging system 100. The system 100 includes an N×M array 110 of pixels P. The system 100 may be monochromatic or color. If the system 100 is a color system, the pixels P in the array 110 would be sensitive to the primary colors of red, green, or blue, and would typically be arranged in a Bayer pattern (i.e., alternating rows are comprised of green/red and blue/green sensitive pixels in adjacent columns).

Each pixel P in the array 110 converts incident light into electrical energy, which is output as an electrical signal. The signals from the N pixels forming a row in the array 110 are typically simultaneously output on respective column lines to respective sample-and-hold circuits 120, which store the electrical signals. These signals are then selected, one pixel at a time, for further processing by a driver 130, and then converted into a digital signal by an analog-to-digital (A/D) converter 140. The digital signals are further processed by a digital processing section 150, and then stored by a storage device 160. When all the signals stored in the sample-and-hold circuits 120 have been processed, another row of signals is output and stored in the sample-and-hold circuit 120 and the processing continues until each row of the N×M array 110 has been processed. The above described processing may be controlled by a control circuit 170. Alternatively, control circuit 170 may include a plurality of control circuits.

An ideal pixel would output an analog pixel signal with no noise component in a manner consistent with the amount of incident light upon the pixel. In order to achieve a high fidelity image, a conventional high resolution (e.g., 12 to 14 bits) A/D converter is typically used to convert the pixel signal into a digital signal. However, one drawback associated with conventional high resolution A/D converters is that they require a relatively long time to perform each A/D conversion. For example, converter 140 might be based on a "ramp" design, which requires many processing steps in the A/D conversion.

Now referring to FIGS. 2A and 2B, it can be seen that a ramp type A/D converter 200 operates by sampling and holding the input signal (Vs) over a sampling period (ts) comprised of a plurality of clock cycles (1 tc, 2 tc, . . . , 8 tc). The A/D converter 200 is initialized when the start pulse control 201 generates the logical high portion of a start pulse. This resets the value stored in counter 204, resets the state of the ramp generator 205, and causes the AND gate 203 to output a low logical state. Thereafter, during each clock cycle (1 tc-8 tc), the value of the counter 204 is incremented by one, and the state of the ramp generator 205 is changed to cause the ramp generator 205 to generate a new reference signal Vr. A comparator 206 compares the reference signal Vr against the input signal Vs. If the magnitude of the reference signal Vr does not exceed that of the input signal Vs, the comparator 206 outputs a logical high state to the AND gate 203, which when combined with a clock pulse generated by clock 202 and the low logical state portion of the start signal, toggles the clock inputs of counter 204 and ramp generator 205.

Each time counter 204 is toggled, it increases is value by one. Thus, on each successive cycle, the ramp generator 205 generates a higher magnitude reference voltage Vr until the magnitude of the reference voltage Vr exceeds the magnitude of the sample signal. Thereafter, the comparator outputs a low logical state to AND gate 203, causing the AND gate 203 to continually output a low logical state, thereby freezing the counter value. When enough clock cycles have elapsed to constitute an entire sample period, the counter value is equal to the digitally converted value. Once the counter value has been read out, the start pulse control can generate a new start pulse to cause the A/D converter 200 to being the conversion process again.

It should be apparent from the discussion above with respect to FIGS. 2A-2B that an I-bit ramp type A/D converter requires a minimum sampling time equal to $2^I$ clock cycles in order to permit sufficient time to compare the maximum ramp value with the input signal. Thus, the throughput of an imaging system 100 (FIG. 1) is at least partially limited by the speed of the A/D converter 140, especially when high resolution (e.g., I=12 or more) A/D conversion is employed. Accordingly, there is a need for a method and mechanism for performing high resolution A/D conversion at a faster rate.

SUMMARY OF THE INVENTION

Embodiments of the present invention provide an A/D converter, and method of operation of same, which utilizes a variable quantization system for converting analog signals into digital signals. The variable quantization is controlled so that at low signal levels the quantization is similar or identical to conventional A/D converters, while the quantization level is increased at higher signal levels. Thus, higher resolution is provided at low signal levels while lower resolution is produced at high signal levels.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 3:
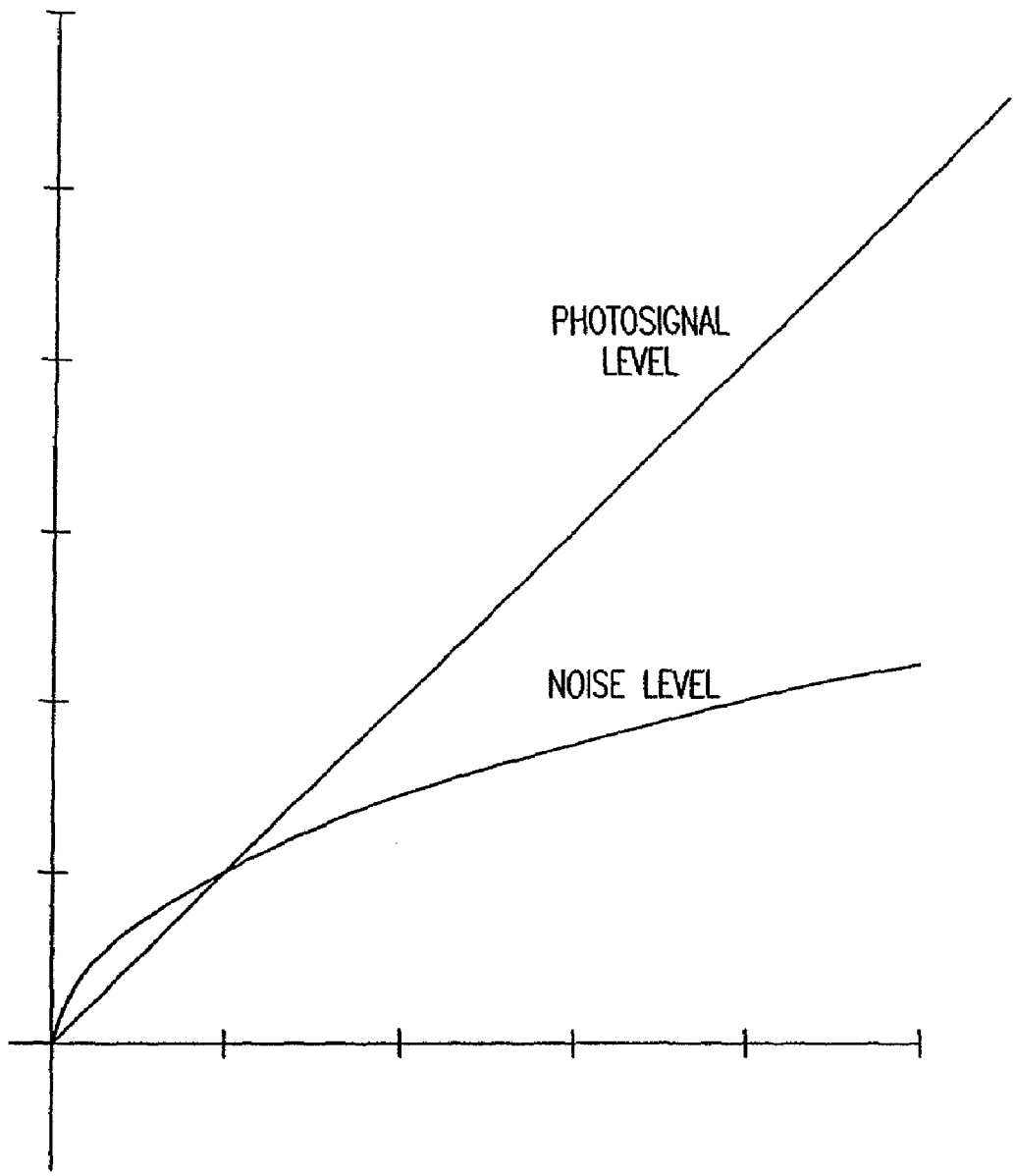
FIG. 3 is a graph illustrating the relative levels of photo and noise signals from a pixel.

Now referring to the drawings, where like reference numerals designate like elements, there is shown in FIG. 3 a graph illustrating the relationship between photo signal level (i.e., pixel signal level) and noise level. As shown in FIG. 3, the noise level is approximately the square root of the photo signal level. Thus, as the photo or pixel signal level increases, so does the noise level, however, the gap between the pixel signal level and the noise level also increases.

Figure 4A:
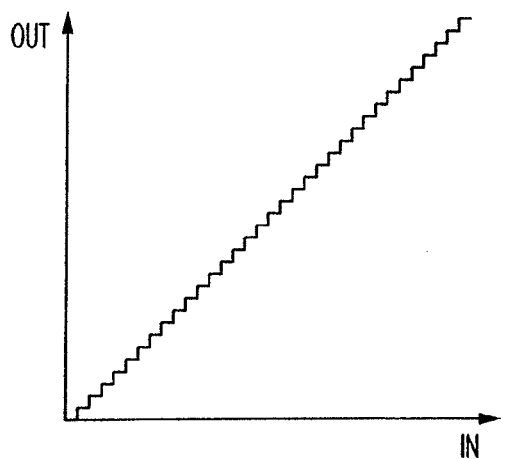
FIGS. 4A-4C are graphs illustrating different transfer functions between an input analog voltage and an output digital word.

In the present invention, a variable quantization A/D converter is utilized to implement an alternate transfer function between an input analog voltage and a output digital word, in order to take advantage of the above illustrated relationship. Referring now to FIG. 4A, the linear transfer function between an input analog voltage IN and a output digital word OUT from a conventional A/D converter is illustrated. As shown in FIG. 4A, in a conventional A/D converter, the output digital word varies linearly with the input analog signal. The slope and the step increments of the transfer function in FIG. 4A remains unchanged between low and high levels of the input signal IN, indicating that the same precision is retained in the conversion across all input signal levels.

As illustrated in FIG. 3, in an imaging system, at low photo signal levels, noise levels are low, thereby permitting high precision A/D conversion. However, at high photo signal levels, noise levels also increase, thereby making high precision A/D conversion increasingly problematic as photo signal levels increase. Thus, as is discussed below, FIGS. 4B and 4C illustrate alternate transfer functions of an input analog voltage and an output digital word that would be more suitable for use in imaging systems than the transfer function illustrated in FIG. 4A.

Figure 4B:
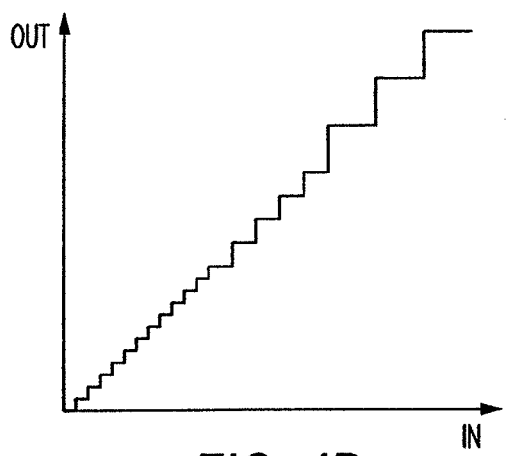

Now referring to FIG. 4B, it can be seen that the illustrated transfer function behaves identically to the transfer function of FIG. 4A at low input signals IN levels. At increasing levels of the input signal IN, however, the increment between conversion steps (in both the IN and OUT axis) are also increased. That is, while transfer functions of FIGS. 4A and 4B span the same input IN and output OUT ranges, in the transfer function of FIG. 4B, at higher levels of the input signal, increasing levels of the input signal IN are mapped to the same output signal value and a lesser number of output signal values OUT are valid outputs.

Figure 4C:
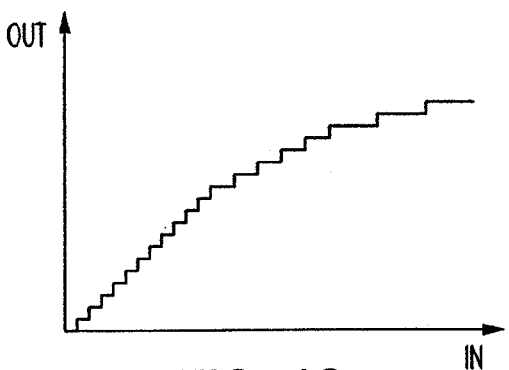

The transfer function illustrated in FIG. 4C also behaves identically to the transfer function of FIG. 4A at low input signal IN levels. At increasing levels of the input signal IN, however, the increment in conversion steps for the IN axis is increased while the increment in conversion steps for the OUT axis is unchanged. That is, in comparison to the transfer function of FIG. 4A, the transfer function of FIG. 4C spans the identical range of IN values while spanning a lesser range of OUT values. Further, at increasing levels of the input signal IN, an increasing number of levels of the input signal are mapped to the same OUT value. Although the same number of OUT values are valid outputs for the transfer functions shown in FIGS. 4B and 4C, the range of OUT values for the transfer function of FIG. 4B spans the same range as that of FIG. 4A while the range of OUT values for the transfer function of FIG. 4C spans a lesser range than that of FIGS. 4A and 4B. In one exemplary embodiment, the transfer function illustrated in FIG. 4A would be a 12-bit linear transfer function, while the transfer functions of FIGS. 4B and 4C would be 10-bit transfer functions (i.e., the number of valid output signals OUT has been reduced by a factor of 4 over the transfer function of FIG. 4A).

The transfer function of FIG. 4B is generally known as a linear mode transfer function while the transfer function of FIG. 4C is generally known as a compressed mode transfer function. A variable quantization A/D converter in accordance with the principles of the present invention may be constructed using either the linear or compressed mode transfer functions by using a modified version of the circuit of FIG. 2B. Essentially, the circuit of FIG. 2B can be used, except that the ramp generator 205 and the counter 204 will be replaced with different ramp generators and counters.

Figure 5A:
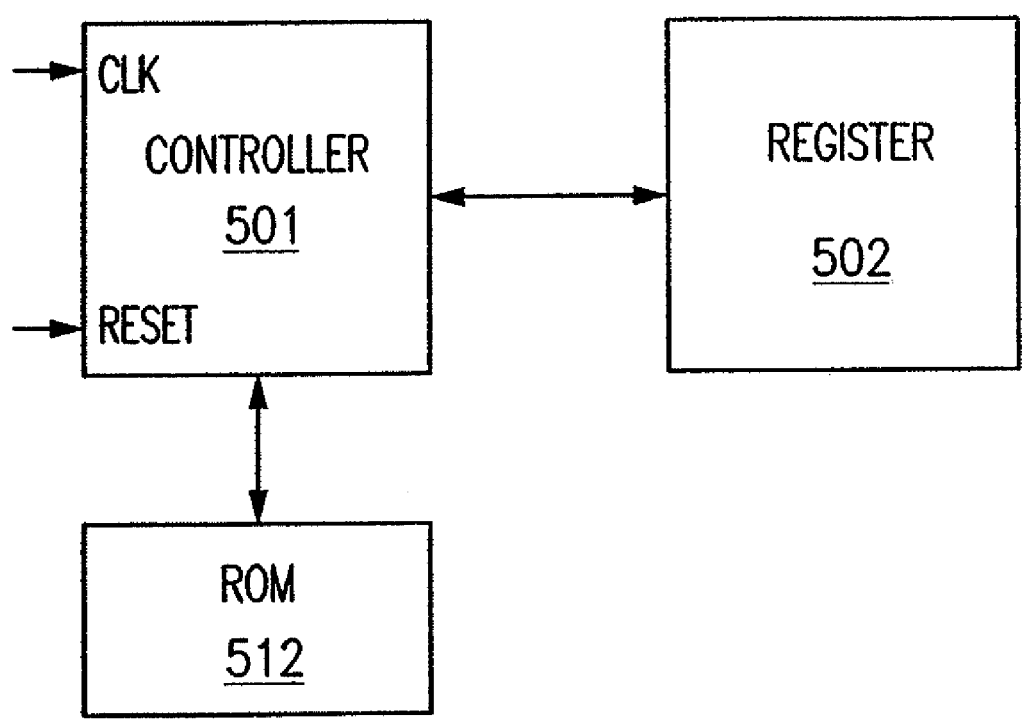
FIG. 5A is a block diagram of a circuit for replacing counter 204 in FIG. 2B.
Figure 5B:
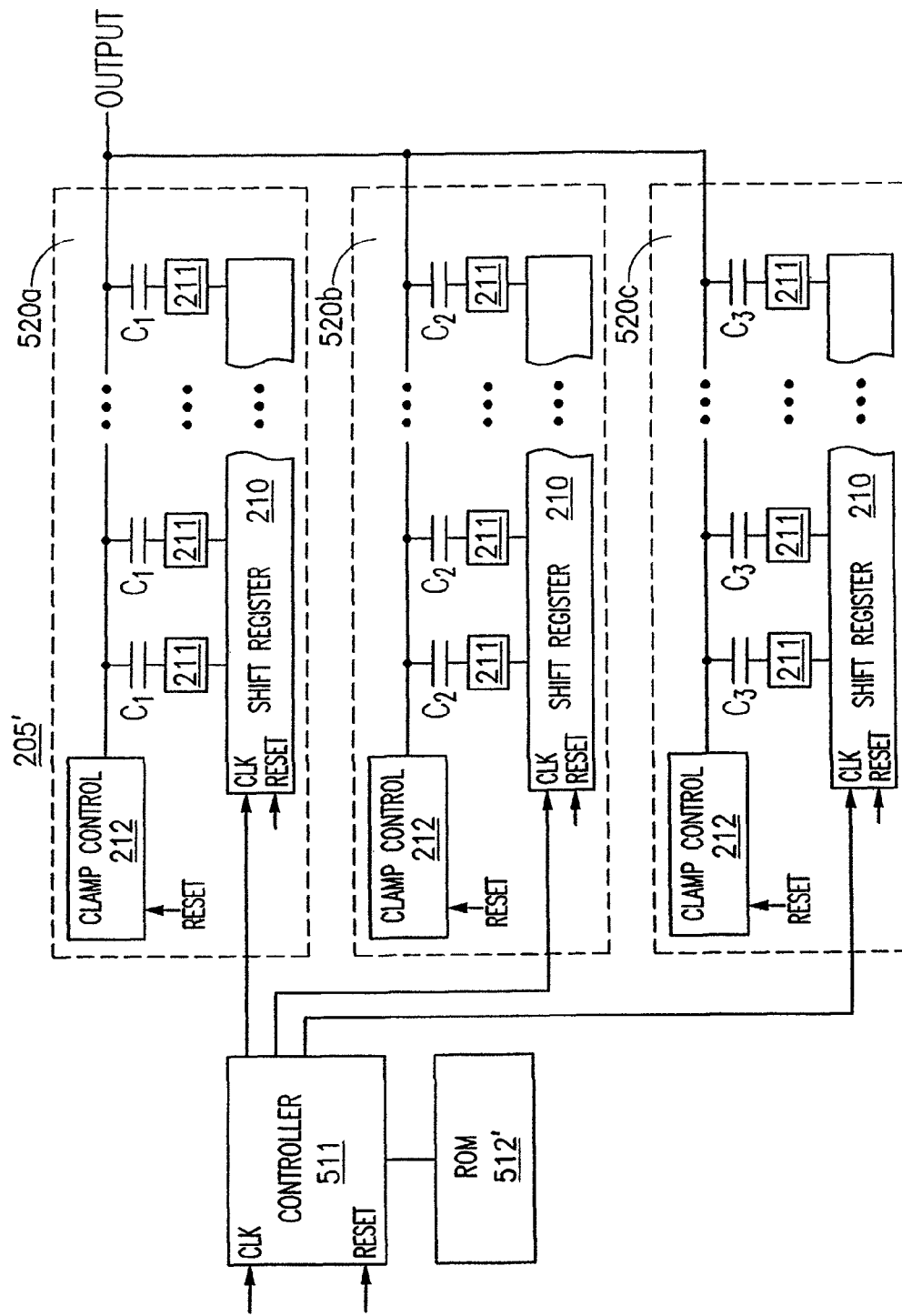
FIG. 5B is a block diagram of a ramp generator having multiple capacitor banks.

More specifically, to implement the linear mode transfer function, both the ramp generator 205 and the counter 204 are modified so that at increasingly high signal levels both circuits ramp up in identical steps consistent with the transfer function as shown in FIG. 4B. That is, when the ramp voltage begins to increment in double steps, the counter must also increment in double steps. As the ramp voltage increments increases further, so must the counter. To implement the compressed mode transfer function, the original counter 204 is utilized while the ramp generator 205 is modified so that at increasingly high signal levels the ramp generator ramps up in steps consistent with the transfer function as shown in FIG. 4C. Referring now to FIGS. 5A and 5B, it can be seen that the linear mode transfer function embodiment of the invention may be implemented by replacing the counter 204 in FIG. 2B with the circuit 204' of FIG. 5A. Furthermore, implementing either the linear mode or the compressed mode transfer function of the present invention also requires replacing the ramp generator 205 of FIG. 2B with ramp generator 205' of FIG. 5B.

Figure 1:
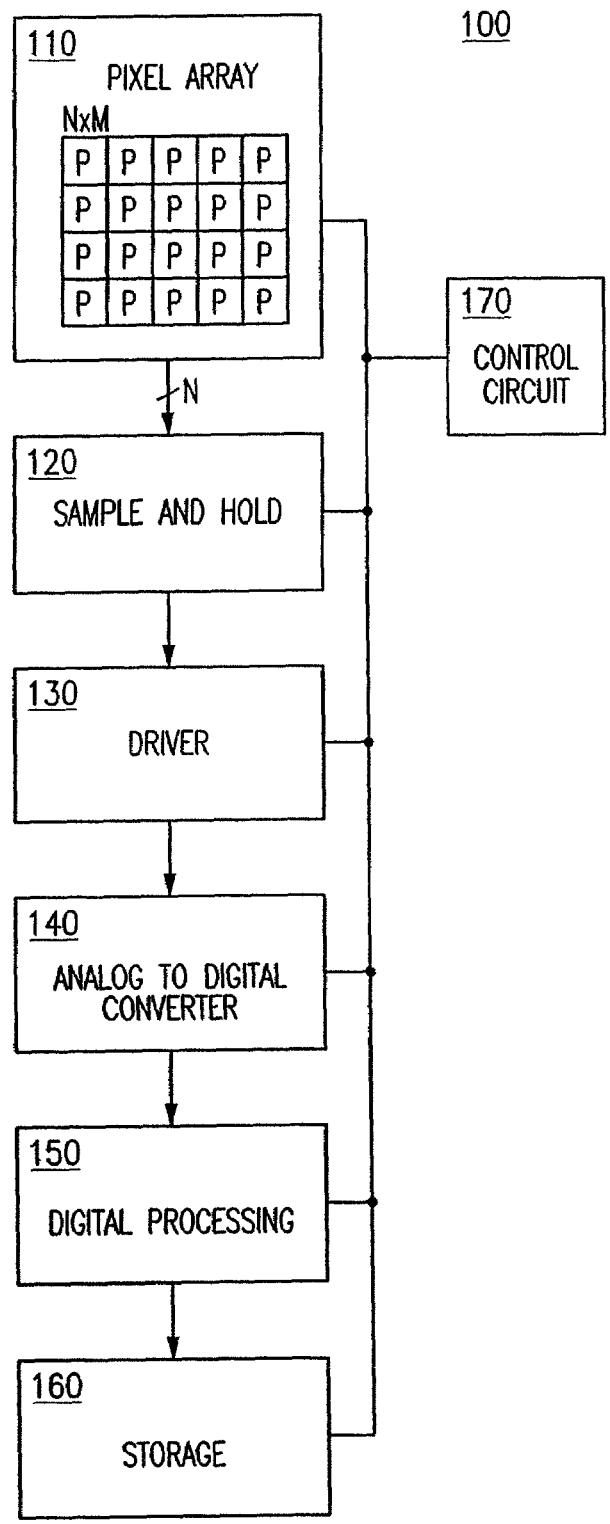
FIG. 1 is a block diagram of a conventional imaging system.
Figure 2A:
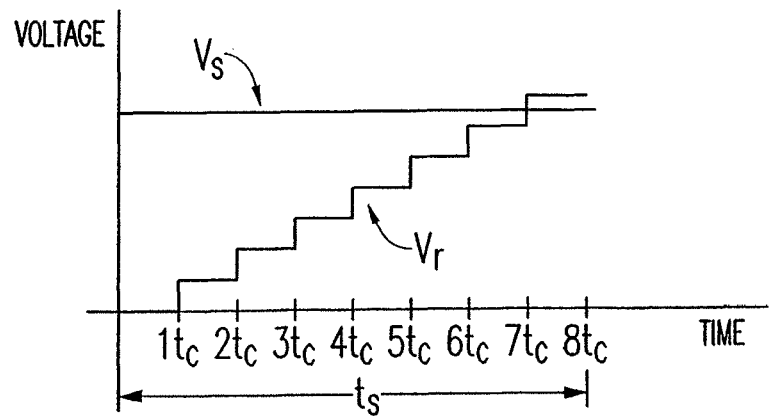
FIG. 2A is a diagram illustrating the operation of a conventional ramp type A/D converter.
Figure 2B:
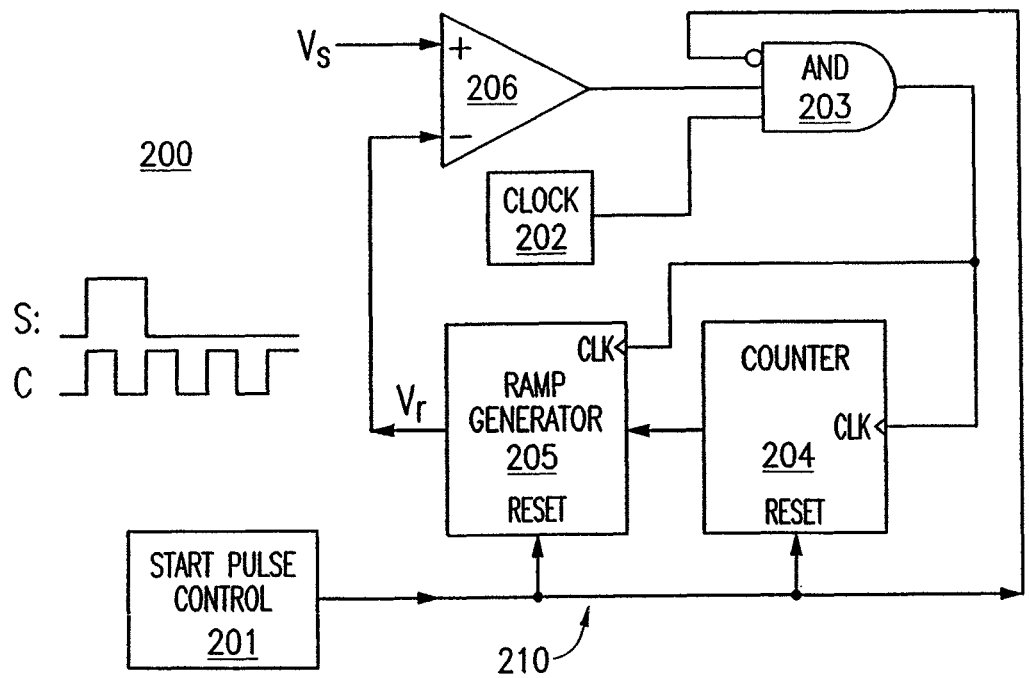
FIG. 2B is a block diagram of a conventional ramp type A/D converter.

In the new counter circuit 204' illustrated in FIG. 5A, the clock and reset signals previously supplied to counter 204 in FIG. 2B are routed to a controller 501, which reads successive values from a ROM 512. The ROM 512 contains the output values OUT for the transfer function of FIG. 4B or FIG. 4C. The controller 501 loads each successive output value from the ROM 512 into the register 502 as the clock signal is incremented. When the reset signal is pulsed, the controller is set to read the next output value from the ROM 512 starting at the ROM's first address.

In FIG. 5B, the new ramp generator 205' includes multiple capacitor banks 520a, 520b, 520c. Each capacitor bank 520a, 520b, 520c differs only in that the capacitance of each capacitor in a particular bank is different from those of the other banks. For example, in one embodiment, the capacitance of each capacitor $C_1$ is one quarter that of the capacitance of each capacitor $C_3$, and the capacitance of each capacitor $C_2$ is one half of that of the capacitance of each capacitor $C_3$. The outputs from each capacitor bank 520a, 520b, 520c are coupled together to form a single output from the ramp generator 205'. The use of different capacitor banks with different capacitances permits the use of fewer capacitors to span the reduced number of required output voltages.

The clock and reset signals previously supplied to the single shift register 210 in FIG. 2C are now instead supplied to a controller 511. The controller 511 is coupled to a ROM 512' which stores code words corresponding to the transfer function of FIG. 4B. More specifically, the code words are used to instruct the controller 511 to increment one or more of the clock signals and/or to reset one or more of the shift registers 210, in the plurality of capacitor banks 520a, 520b, 520c in order to provide a ramp voltage consistent with the desired transfer function.

Figure 5C:
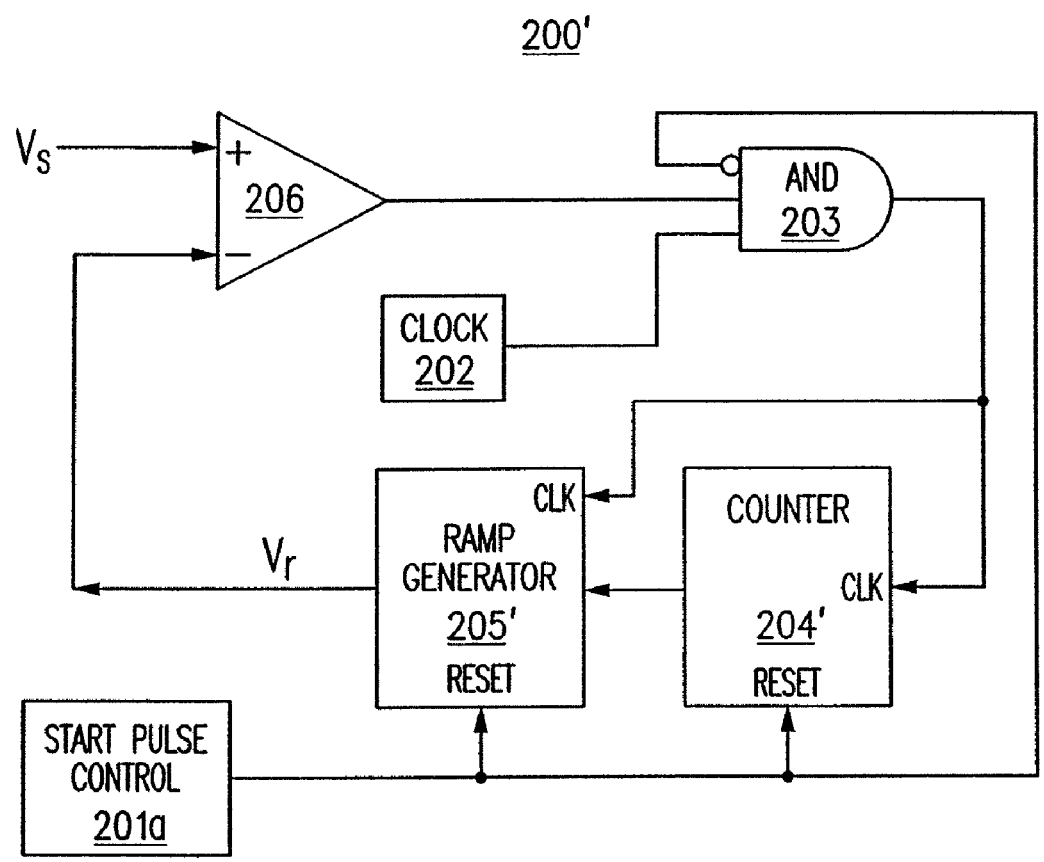
FIG. 5C is a block diagram of a A/D converter in accordance with one embodiment of the present invention.

FIG. 5C is a block diagram of an A/D converter 200' in accordance with one embodiment of the present invention. The A/D converter 200' includes many of the same parts as the conventional A/D converter 200 (FIG. 2), but respectively substitutes the above described ramp generator 205' and counter circuit 204' in place of the conventional ramp generator 205 and counter 204. Thus, the A/D converter 200' can implement the linear or compressed mode transfer functions as described above.

Figure 6:
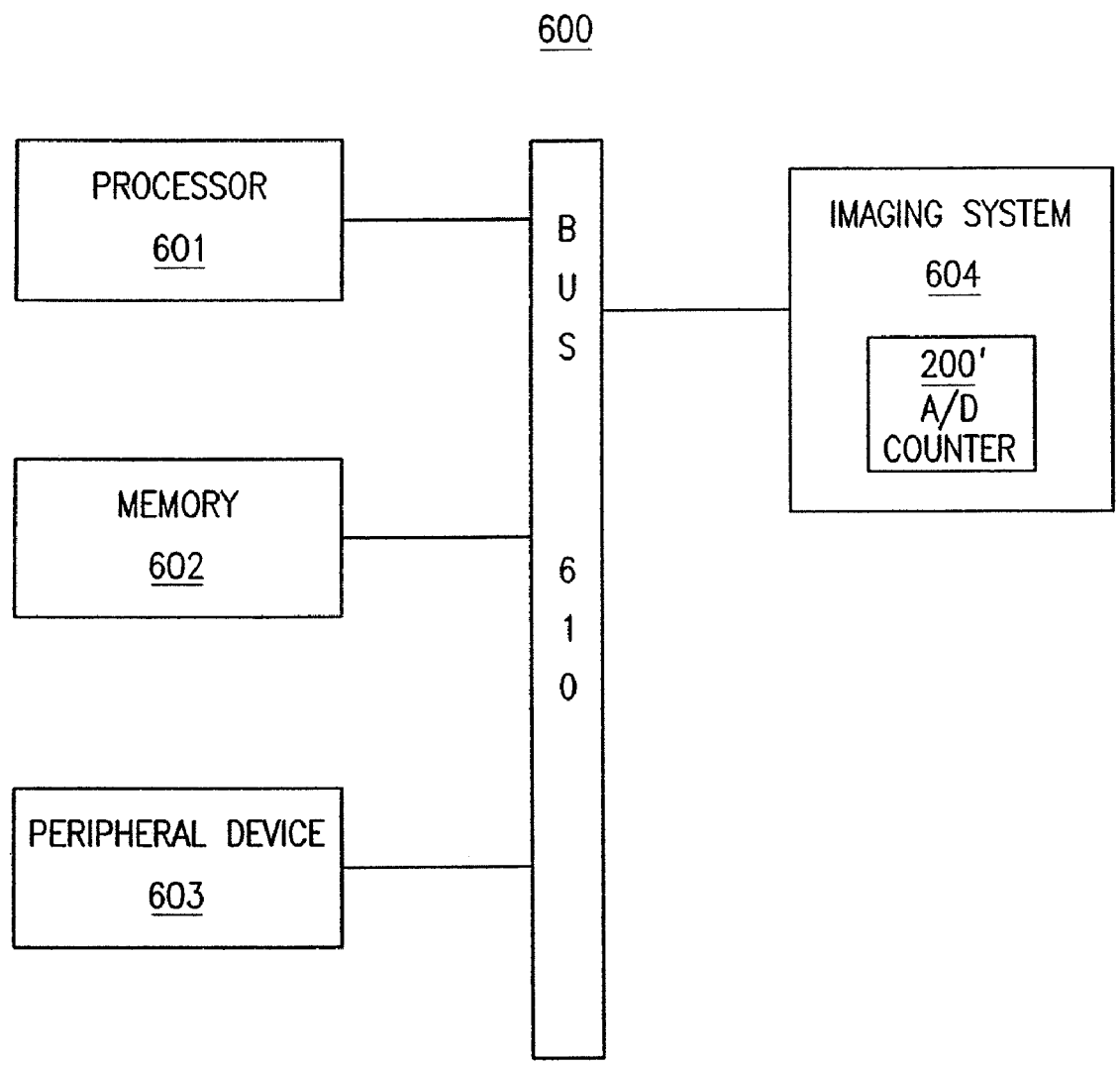
FIG. 6 is a block diagram of a processor based system utilizing the present invention.

FIG. 6 is an illustration of a processor based system 600 incorporating a processor 601, a memory 602, at least one peripheral device 603, and an imaging system 604, each coupled to a bus 610. The imaging system 604 incorporates at least one A/D converter 200' (FIG. 5C) of the invention.

The present invention therefore provides for the use of variable quantization A/D conversion in an imaging system. According to one embodiment, a variable quantization A/D converter provides the variable levels of quantization, and is operated such that at higher levels of the input signal, the degree of quantization is increased. This embodiment provides for faster A/D conversion, for example, in a ramp type A/D converter. In accordance with another aspect of the invention, a ramp generator includes a plurality of capacitor banks, with each capacitor bank utilizing capacitors of varying values. In one embodiment, the capacitance of the capacitors of each capacitor bank are related as powers of 2 to one of the capacitor banks. The choice between the transfer functions illustrated in FIGS. 4B and 4C is left to the designer of the imaging system. However, it should be recognized that the invention may also be practiced in a variety of other manners. For example, the invention may also be practiced by a combination of a linear and non-linear A/D converters. Alternatively, the invention may also be practiced by passing the output of a linear A/D converter to a non-linear processing circuit which performs non-linear signal mapping/compression. Such a processing circuit might, for example, map or compress output of a linear A/D converter by using a look-up table to map input values to output values.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A method for converting an analog signal to a digital word, comprising:
   associating an input signal to an output digital word with either a first or second transfer function only;
   receiving an input signal and, based on the predetermined association, mapping the input signal to the digital word exclusively with either the first transfer function or the second transfer function, wherein:
   the first transfer function is not included in the second transfer function, and
   the second transfer function is not included in the first transfer function.

2. The method of claim 1, wherein the predetermined association is such that the first transfer function maps each input signal below a predetermined threshold to a corresponding reference signal in a linear manner.

3. The method of claim 2, wherein the predetermined association is such that the second transfer function maps each input signal at least equal to a predetermined threshold to corresponding reference signals in a logarithmic manner.

4. A method for converting an analog signal to a digital word, comprising:
   receiving an analog input signal;
   associating a parameter of the analog input signal to an output digital word with either a first or second transfer function only;
   evaluating the parameter of the analog input signal against a predetermined threshold and, if the parameter of the analog input signal is not greater than a predetermined threshold, mapping the parameter to a digital word in accordance with a first transfer function; and
   if the parameter is at least equal to the predetermined threshold, mapping the parameter to the digital word in accordance with a second transfer function,
   wherein:
   the first transfer function maps each parameter below the predetermined threshold to a corresponding reference signal in a linear manner, and
   the second transfer function maps a set of non-sequential and increasing parameters each at least equal to the predetermined threshold to corresponding reference signals in a linear manner.

5. A method for operating an imaging system, comprising:
   receiving an analog pixel signal from a pixel;
   converting the analog pixel signal into a digital word, wherein the converting comprises:
   selecting a parameter of the analog signal to measure against a predetermined threshold;
   measuring the parameter of the received analog pixel signal;
   mapping the parameter to a digital word with a predetermined first and second transfer function only, wherein:
   if the parameter is less than a predetermined threshold, mapping the parameter to the digital word exclusively with the first transfer function,
   if the parameter is at least equal to the predetermined threshold, mapping the parameter to the digital word exclusively with the second transfer function,
   the first transfer function is not included in the second transfer function, and
   the second transfer function is not included in the first transfer function.

6. The method of claim 5, wherein the first transfer function maps each parameter below the predetermined threshold to a corresponding reference signal in a linear manner.

7. The method of claim 6, wherein the second transfer function maps each parameter at least equal to the predetermined threshold to corresponding reference signals in a logarithmic manner.

8. A method for operating an imaging system, comprising:
   receiving an analog pixel signal from a pixel;
   converting the analog pixel signal into a digital word, wherein the converting comprises:
   selecting a parameter of the analog signal to measure against a predetermined threshold;
   measuring the parameter of the analog signal;
   if the parameter is not greater than a predetermined threshold, mapping the magnitude to a digital word in accordance with a first transfer function; and
   if the parameter is at least equal to the predetermined threshold, mapping the parameter to the digital word in accordance with a second transfer function, wherein:

the first transfer function maps each parameter below the predetermined threshold to a corresponding reference signal in a linear manner, and the second transfer function maps a set of non-sequential and increasing parameter increments each at least equal to the predetermined threshold to corresponding reference signals in a linear manner.

9. The method of claim 1 wherein the input is the magnitude of the analog signal.

10. The method of claim 4 wherein the parameter is the voltage magnitude of the analog signal.

11. The method of claim 6 wherein the parameter is the voltage magnitude of the analog signal.

12. The method of claim 7 wherein the parameter is the voltage magnitude of the analog signal.

13. The method of claim 8 wherein the parameter is the voltage magnitude of the analog signal.

* * * * *